United States Patent [19]

Loth

[11] Patent Number: 4,849,299

[45] Date of Patent: Jul. 18, 1989

[54] WATCH COVER GLASS AND PROCESS FOR THE MANUFACTURE OF SUCH A GLASS

[75] Inventor: Eric Loth, Bienne, Switzerland

[73] Assignee: Montres Rado S.A., Lengnau, Switzerland

[21] Appl. No.: 131,792

[22] Filed: Dec. 11, 1987

[51] Int. Cl.⁴ .................... C03C 17/06; C03C 27/04; C23C 13/02; G04B 39/02
[52] U.S. Cl. ................. 428/542.2; 428/698; 428/426; 427/38
[58] Field of Search .............. 428/542.2, 698, 699, 428/426, 701; 427/38

[56] References Cited

FOREIGN PATENT DOCUMENTS 0095009 11/1983 European Pat. Off. ......... 428/542.2
0012611 3/1984 Japan .............................. 428/542.2
0141647 7/1985 Japan .
608326 3/1976 Switzerland .

Primary Examiner—Nancy A. Swisher
Attorney, Agent, or Firm—Sughrue, Mion, Zinn, Macpeak & Seas

[57] ABSTRACT

Sapphire watch cover glass or crystal.

The glass or crystal (18) comprises on a part of its upper face, a superficial layer (28) having an amorphous structure. This layer (28) makes it possible to increase the hardness of the glass or crystal in its exposed parts whilst reducing the risk of breakage of said glass or crystal.

9 Claims, 2 Drawing Sheets

WATCH COVER GLASS AND PROCESS FOR THE MANUFACTURE OF SUCH A GLASS

TECHNICAL FIELD OF THE INVENTION

The instant invention relates to a sapphire watch cover glass or crystal. This cover glass has surfaces designed to form part of the exterior surfaces of the watch. This type of cover glass is said to confer to the watch a striking and long-lasting durable aesthetic appearance due to the great abrasion resistance of sapphire. It has, however, been found in practice that the risk of breakage of this type of glass is not negligible. This risk increases as the thickness of the glass decreases. Nevertheless, it is known that, to produce aesthetic watches, designers try to make a watch as thin as possible.

The instant invention also relates to a process for the manufacture of sapphire glasses or crystals as defined above.

BRIEF SUMMARY OF THE INVENTION

It is an object of the instant invention to produce a sapphire cover glass or crystal having improved resistance to breakage. To achieve this object, one part of the glass designed to form at least part of the outer surface of the watch comprises a zone in which the sapphire presents a surface layer in which the crystalline structure of the sapphire is destroyed over a substantial thickness.

A cover glass of this kind can be produced using the claimed process in which, after having cut the glass from a block of sapphire and polished the faces of the glasses, one zone, belonging to a part of the cover glass designed to form at least partially the exterior surface of the watch, is subjected to a treatment designed to destroy the crystalline structure of the sapphire over a substantial thickness of the sapphire in the superficial layer of said zone.

In a preferred embodiment, this treatment comprises ionic bombardment with ions having an atomic number between 5 and 45, or even between 3 and 80 according to the Mendeleev Table.

It is already known that the implantation of ions in a sapphire crystal makes it possible to increase the hardness of the sapphire and to reduce the risk of breakage. An approach of this kind is developed in the article entitled Ion implantation and thermal annealing of alpha-$Al_2O_3$ single crystals (J. APPL. PHYS. 54(2), February 1983). This article shows in particular that implantation of chromium ions in the sapphire makes it possible to increase the hardness of the surface by more than 40% and to reduce the risk of breakage by 15%. This result has been obtained by implanting chromium ions at the ambient temperatures with an energy comprising between 280 and 300 keV, the density of the ions being between $10^{16}$ and $10^{17}$ ions per $cm^2$. Such an operation is aimed at considerably modifying the crystalline structure of the superficial layer to such an extent that the parameters inherent in the crystalline structure of sapphire can hardly be observed. This layer may be regarded as having an amorphous structure, or at least a structure in which the crystalline structure is destroyed over a substantial thickness.

It is clear that modification of the crystalline structure of sapphire over a layer of the order of 1 micrometre of thickness is capable of modifying the optical characteristics of the crystal. This aspect is not mentioned in the above cited article. Nevertheless, tests have revealed a slight opacification of the crystal which is incompatible with horological applications since the sapphire must be perfectly transparent in order to permit reading of the time information.

It has been found in practice that in about 80% of cases of breakage of sapphire watch glasses, the beginning of the breakage had its origin in one of the lateral faces of the glass. As a result, it is possible to obtain a considerable improvement in the mechanical characteristics of the glass by modifying the structure of the sapphire in only part of its surface.

BRIEF DESCRIPTION OF THE DRAWINGS

The invention will now be described with reference to the accompanying drawings, in which.

DETAILED DESCRIPTION OF THE DRAWINGS

Figure 1:
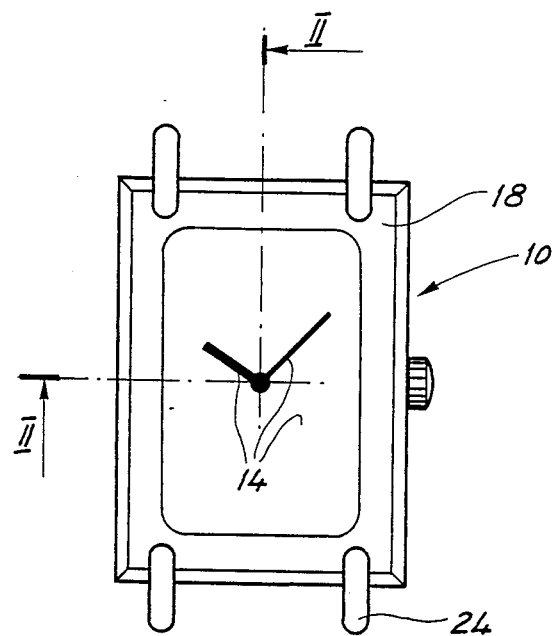
FIGS. 1 and 2 represent a watch provided with a glass according to the invention in plan view and in section.
Figure 2:
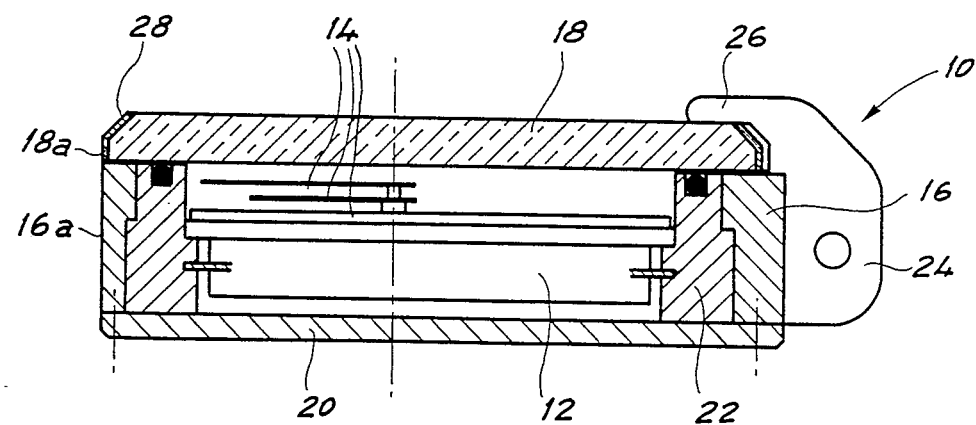

The watch shown in FIGS. 1 and 2 comprises a housing 10, a movement 12 and fixing means 14 for the hands and a dial. The housing 10 comprises a case band 16, a sapphire cover glass or crystal 18, a base 20 and an encircling ring 22. The case band 16 is equipped with four horns 24 which extend above the body of the case band and form claws 26 defining, with the body of the case band, a slide in the interior of which the glass 18 is lodged. The base 20 is fixed to the case band 16 by screws not shown on the drawing. It also rests against the encircling ring 22. This latter extends over the entire height of the body of the case band 16 and rests against the glass 18. In this manner, when the base 20 is fixed by means of screws, the encircling ring 22 exerts pressure on the glass 18 which rests against the claws 26. This construction is well known to the man skilled in the art and there is thus no need to describe it in more detail. It should, nevertheless, be mentioned that in this construction the cover glass 18 completely covers the case band 16. This means that the lateral faces 16a of the case band and 18a of the watch cover glass or crystal are aligned. Since this glass 18 is of sapphire, it is virtually unscratchable, given the hardness of this material. The watch is consequently particularly well protected.

Nevertheless, as has been stated above, it does occasionally happen that glasses break during wear. This is all the more disturbing since the cost of the sapphire cover glass is high. It has been found that in about 80% of these cases, the beginnings of the breaks were to be found in the lateral faces of the glass. This can be understood because one can calculate on a theoretical basis of the mechanics of breakage that a scratch only 2 um thick can cause breakage of the entire sheet as soon as the site of the scratch is submitted to a strain exceeding the elastic limit. And yet the lateral faces of the cover glass are that part of the housing that is subjected to the greatest mechanical wear, in other words the most susceptible to be scratched and the part most subject to shocks.

To counteract this disadvantage, the lateral faces 18a of the glass 18 have a superficial layer 28 in which the crystalline structure of the sapphire has virtually disappeared. This disappearance can be brought about using processes to be described below. Layer 28 is very thin, typically 1 um in thickness. It increases the, already considerable, microhardness of sapphire by about 10 to 40%. Moreover it makes it possible to reduce the risk of breakage. This appears to be due to the fact that the greatly disturbed structure of this layer 28 prevents the propagation of fissures through the crystal. In a sense it forms a kind of protective ring surrounding the cover glass and protects the cover glass in its most exposed part. Due to its greatly modified structure, it is evident that the optical characteristics of this layer 28 are no longer the same as those of the sapphire forming the remainder of the sheet. This is not of great importance since the layer 28 does not necessarily have to cover the entire cover glass, the covering of the lateral faces and/or the visible ridges already permitting real improvement in the solidity of the cover glass.

To manufacture a watch sapphire cover glass such as defined above one can use a number of techniques such as irradiation with the aid of a beam of electrons or a laser beam or that known as ionic implantation. This latter technique consists in making ions of the material to be implanted penetrate into the material of the glass by projecting them violently against the surface of this latter material.

When the material to be implanted is solid, the ions are obtained by projection of electrons against a target comprising this material, which exerts a disrupting force on the ions. When the material to be implanted is gaseous, the ions are obtained by subjecting this material to an electric discharge. The ions thus obtained are then accelerated by an electric field before being projected onto the object to be treated. This operation is effected in a vacuum and at a temperature close to the ambient temperature. For a given material and a given type of ions, the kinetic energy of the ions at the moment of impact substantially defines the thickness of the layer, the structure of which is modified whilst the density of the ions defines the degree of modification of the structure of this layer.

In the case of sapphire, different types of ions may be used. Trials yielding satisfactory results have been conducted by implanting ions of chromium, zirconium, titanium and nitrogen. For example, by implanting chromium or titanium ions having an energy of 300 keV and a density of $10^{16}$ to $10^{17}$ ions per $cm^2$, it is possible to obtain an increase in hardness of about 35%. By implanting zirconium ions having an energy of 150 keV and a density of $4 \times 10^{16}$ ions per $cm^2$, it is possible to obtain an increase in hardness approaching 40%. Finally, by implanting nitrogen atoms having an energy of 150 keV at a density of $10^{18}$ ions per $cm^2$, it is possible to obtain an increase in hardness of about 10%.

In all these cases, the increase in the hardness is accompanied by an increase in the durability of the glass, that is to say by a reduction in its susceptibility to the effect of scratches. This improvement is due to the distortion created by bombardment by these ions which penetrate deep into the interior of the crystal. The affected layer can attain 1 um, representing some $10^3$ atomic layers. Within this layer, the density of the implanted ions has an average value in the region of about $10^{-2}$. The effect of such treatment is to distort the crystalline structure in such a way that the parameters which define that of sapphire are no longer present. Indeed, this structure has been distorted to such an extent that it can be termed amorphous.

Figure 3:
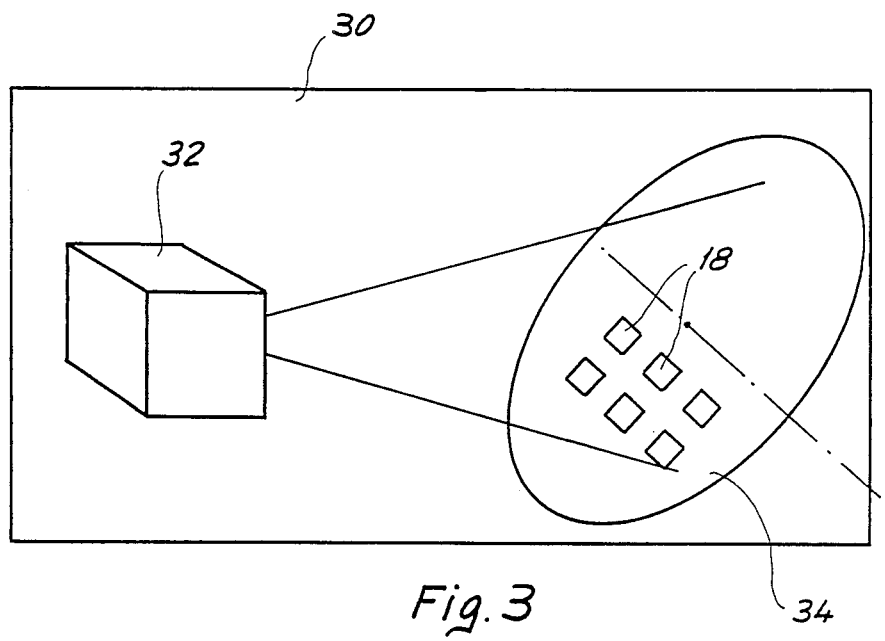
FIG. 3 shows a schematic drawing of a means for the treatment of glasses.

To effect this operation an apparatus is used as schematically represented in FIG. 3. This apparatus has an air-tight enclosure schematically represented by the rectangle 30 in the interior of which there is an ion source 32 and a table 34. The table 34 carries the glasses 18 to be treated. These can be held in place by glueing since the working temperature is sufficiently low. It is also possible to use mechanical means. The glasses 18 are fixed by their lower face. In this manner their upper face and their lateral faces are exposed. The upper surfaces of the glasses 18 are coated with a protective layer except for the periphery. The table 34 is mounted pivotally on an axis in such a way that it is able to turn during the implantation operation.

After the glasses, coated with their protective layer have been fixed to the table and placed inside the enclosure 30, the latter is evacuated. Once the desired vacuum has been attained (of the order of $10^{-6}$ mm Hg), the ions are created by projecting electrons onto a target made from the desired material, the ionized atoms of which are stripped away. These ions are then accelerated by means of an electric field and violently projected onto the table, i.e. also onto the glasses 18. These ions have an angle of incidence of 30° to 70° in relation to the axis of the table. By virtue and because of the rotary movement of the table 34 the ions are implanted in the sapphire into each of the lateral faces as well as into the peripheral part of the upper face of the glasses 18.

When the desired density of ions has been reached the projection of electrons onto the target is interrupted, the pressure is restored in the interior of the enclosure 30 and the glasses 18 are removed from the table 34 and their protective layer removed. They are then ready to be used.

Figure 4:
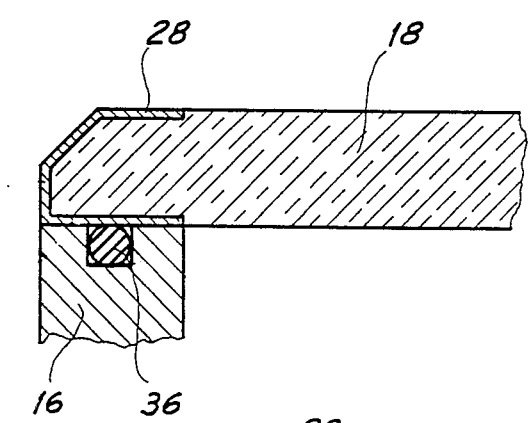
FIGS. 4 and 5 illustrate two other embodiments of glasses according to the invention.

The part of the watch shown in FIG. 4 has a glass 18 which differs from those of FIG. 3 in that the layer 28 extends not only over the lateral faces and on the periphery of the upper surface, but also on the periphery of the lower surface of the glass. By virtue and because of the modifications in its optical characteristics this part of the layer 28 makes it possible to conceal the seal ring 36 with which such a watch is generally equipped both in the visible range (for aesthetic reasons) and in the ultraviolet range (to avoid deterioration in the material of the seal).

Figure 5:
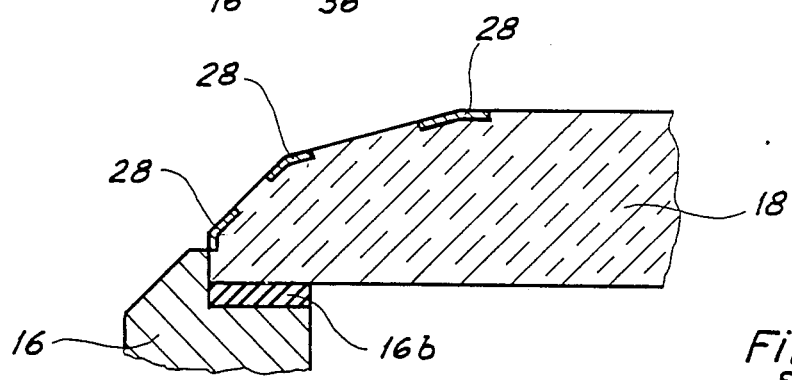

The part of the watch shown in FIG. 5 has a glass which differs from that of FIG. 3 in its more complex geometric form. Moreover, the glass 18 no longer extends up to the edge of the case band 16, but is embedded in a recess 16b on the upper surface of the latter. In this configuration the lateral faces of the glass 18 are better protected. On account of its more complex geometry this glass 18 has a larger number of ridges. Each of these which belong to the upper surface of the glass is reinforced by a layer 28 similar to those which have been described above. This layer 28 extends from one side to the other of the ridge. It may be very narrow, even less than one millimeter in width, or on the other hand entirely cover the peripheral facets which define these ridges.

What is claimed is:

1. A sapphire watch cover glass comprising a part adapted to form at least partially the exterior surface of a watch wherein at least said part comprises a zone in which the sapphire presents a superficial layer in which the crystalline structure of the sapphire has been destroyed over a substantial thickness.

2. A sapphire watch cover glass according to claim 1 wherein said part presents ridges wherein said ridges belong to said zone.

3. A sapphire watch cover glass according to claim 1 or claim 2 comprising lateral faces adapted to form a part of the lateral faces of the watch, wherein said zone occupies the lateral faces of the glass.

4. A sapphire watch cover glass according to claim 1 or 2, wherein said thickness is approximately one micrometer.

5. A process for the manufacture of a sapphire watch cover glass according to claim 1 in which the watch glass is cut from a block of sapphire and the faces of the glass are polished, and in which said zone, belonging to one part of the watch and adapted to form at least partially the exterior surface of the watch, is subjected to a treatment to destroy the crystalline structure of the sapphire over a substantial thickness of the sapphire in the superficial layer of said zone.

6. A process according to claim 5 wherein said treatment comprises ionic bombardment of ions having an atomic number between 5 and 45.

7. A process according to claim 6 wherein the ions are selected from the ions of chromium, zirconium, titanium and nitrogen.

8. A process according to claim 7 wherein said ionic bombardment has a density of from $10^{16}$ to $10^{18}$ ions per $cm^2$ and where the energy of implantation is between 150 and 300 keV.

9. A process according to claim 5, 6, 7 or 8 wherein said thickness is approximately one micrometer.

* * * * *